(12) United States Patent
Jang (10) Patent No.: US 8,716,761 B2
(45) Date of Patent: May 6, 2014

(54) IMAGE SENSOR FOR SEMICONDUCTOR LIGHT-SENSITIVE DEVICE, MANUFACTURING THEREOF, IMAGE PROCESSING APPARATUS USING THE SAME, AND METHOD FOR DETECTING COLOR SIGNAL

(75) Inventor: Hoon Jang, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 13/547,191

(22) Filed: Jul. 12, 2012

(65) Prior Publication Data

US 2013/0037861 A1    Feb. 14, 2013

(30) Foreign Application Priority Data

Aug. 11, 2011    (KR) .................. 10-2011-0080202

(51) Int. Cl.
*H01L 27/148*    (2006.01)

(52) U.S. Cl.
USPC ........... 257/222; 257/225; 257/232; 257/234; 257/440; 257/E27.151; 257/E31.078; 257/E27.13

(58) Field of Classification Search
USPC ............ 257/222, E27.151, E31.078, E27.13, 257/225, 232, 234, 440
See application file for complete search history.

(56) References Cited

U.S. PATENT DOCUMENTS

| 7,830,412 B2 * | 11/2010 | Chinnaveerappan et al. ................. 348/207.99 |
| 2006/0102938 A1 | 5/2006 | Park et al. |
| 2006/0163617 A1 | 7/2006 | Wada et al. |

FOREIGN PATENT DOCUMENTS

| JP | 2008-263041 | 10/2008 |
| KR | 10-2005-0048600 | 5/2005 |
| KR | 10-2005-0064335 | 6/2005 |
| KR | 10-2006-0010899 | 2/2006 |
| KR | 10-0614653 | 8/2006 |

* cited by examiner

*Primary Examiner* — Timor Karimy
(74) *Attorney, Agent, or Firm* — Sherr & Jiang, PLLC (57) ABSTRACT

An image sensor for a semiconductor light-sensitive device including a semiconductor substrate and a light receiving device configured to receive light and generate a signal from the light. The image sensor may include an electron collecting device formed in the semiconductor substrate to receive at least a portion of the electrons generated by the light in the light receiving device. The image sensor may include a first type device isolation film configured to isolate the light receiving device from the electron collecting device. The image sensor may include a shielding film formed over the semiconductor substrate and configured to shield the first electron collecting device from the light.

10 Claims, 6 Drawing Sheets

IMAGE SENSOR FOR SEMICONDUCTOR LIGHT-SENSITIVE DEVICE, MANUFACTURING THEREOF, IMAGE PROCESSING APPARATUS USING THE SAME, AND METHOD FOR DETECTING COLOR SIGNAL

The present application claims priority to Korean Patent Application No. 10-2011-0080202 (filed on Aug. 11, 2011), which is hereby incorporated by reference in its entirety.

BACKGROUND

Light produced from an object existing in nature may have characteristic values in wavelength or similar unit. An image sensor is an apparatus that may pick up an image of an object by using the properties of a semiconductor device responsive to external energy. A pixel of an image sensor may detect light produced from an object and may convert it into an electrical value.

Such an image sensor may be classified into a charge coupled device (CCD) based on silicon semiconductor and a complementary metal oxide semiconductor (CMOS) image sensor fabricated by a submicron CMOS fabrication technology.

Of these image sensors, the CCD is a device in which charge carriers may be stored in a capacitor and transferred such that each MOS capacitor is closely disposed to each other. However, the CCD has various disadvantages, such as relatively complicated drive mode, relatively higher power consumption, impracticability of integrating a signal processing circuit in a chip for the CCD due to many mask processes and other reasons. In order to overcome these disadvantages, many studies may have been done towards development of the CMOS image sensor.

The CMOS image sensor may obtain an image by forming a photodiode (PD) and a MOS transistor within a unit pixel to detect signals in a switching mode. The CMOS image sensor may have the advantages of relatively low manufacturing costs, relatively low power consumption, and relatively easy integration into a peripheral circuit chip in comparison with a CCD. Since a CMOS image sensor may be produced using a CMOS fabrication technology, the CMOS image sensor may be easily integrated into a peripheral system for performing operations such as amplification and signal processing, resulting in minimized manufacturing costs. A CMOS image sensor may have a relatively rapid processing speed and a relatively low power consumption which corresponds to approximately 1% of the power consumption of the CCD.

Meanwhile, because a unit pixel of the CMOS image sensor may realize only one color, filters may be used for each pixel to filter only light of a desired wavelength from white light, and then red, green, and blue (RGB) values for each pixel may be calculated and restored by interpolation or similar. A color filter array for each unit pixel may be formed to realize red, green, and blue colors.

However, image sensors that may realize a fine line width circuit may be accomplished along with the development of semiconductor processing techniques. As the overall chip size, as well as the size of a unit pixel, gets progressively smaller with development, the size of each color filter is also minimized.

A material for producing a color filter array may be a polymer-based material, which may be very difficult to handle in an actual process and has a relatively high likelihood to undesirably maximize the rate of defects of manufactured devices. The polymer-based material of the color filter array may play a major role in minimizing the overall chip performance because it also serves to block the majority of light entering each unit pixel. This is because a color filter is supposed to selectively pass only light in a specific wavelength range, but may be unable to completely filter the light due to the characteristics of the color filter.

Therefore, there may be rise in demand for a method for realizing a color without the use of color filters.

Figure 1:
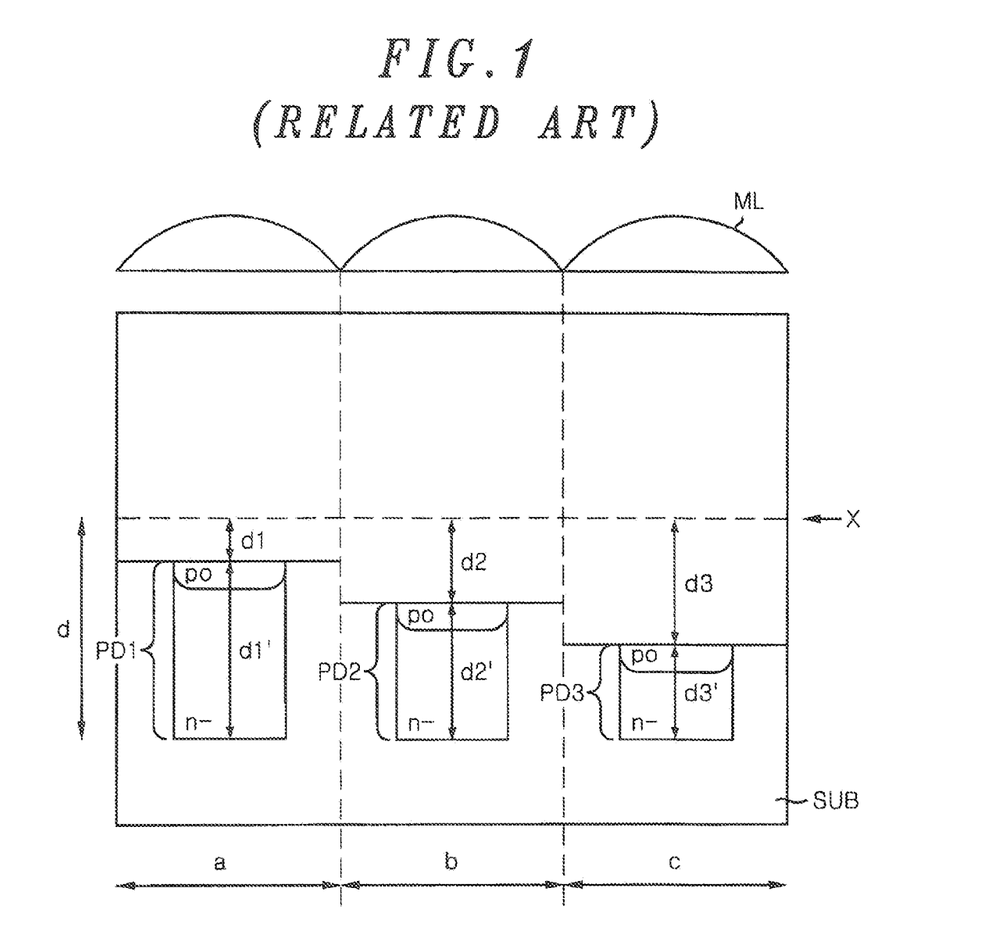
FIG. 1 is a cross-sectional view of a color image sensor from which color filters are removed, according to the related art.

FIG. 1 is a cross-sectional view of a color image sensor from which color filters are removed, according to the related art. Referring to FIG. 1, the image sensor according to the related art may include at least one of: (1) A substrate SUB which may be etched at a First thickness d1 in a first unit pixel region 'a' for realizing a color (e.g. R or magenta) of a first wavelength, etched at a second thickness d2 which may be relatively greater than the first thickness d1 in a second unit pixel region 'b' for realizing a color (e.g. G or yellow) of a second wavelength relatively shorter than the first wavelength, and etched at a third thickness d3 which may be relatively greater than the second thickness d2 in a third unit pixel region 'c' for realizing a color (e.g. B or cyan) of a third wavelength relatively shorter than the second wavelength. (2) first photodiode PD1 formed at a first depth d1 from the substrate SUB etched in the first unit pixel region 'a'. (3) A second photodiode PD2 formed at a second depth d2' which may be relatively greater than the first depth d1' from the substrate SUB etched in the second unit pixel region 'b'. (4) A third photodiode PD3 formed at a third depth d3' which may be relatively greater than the second depth d2' from the substrate SUB etched in the third unit pixel region 'c.' Here, 'X' may indicate the position of the substrate SUB before etching.

The distance from the rear surface of the substrate SUB to each of the bottoms of the first photodiode PD1, the second photodiode PD2, and the third photodiode PD3 may be substantially equal. In other words, the sum of the first thickness d1 and the first depth d1', the sum of the second thickness d1 and the second depth d2', and the sum of the third thickness d3 and the third depth d3' may be substantially equal to each other.

The substrate SUB may be composed of a first conductive, such as P-type, relatively highly doped region P++ and a first conductive epi-grown region P-epi.

The first to third photodiodes PD1 to PD3 may each include a first impurity region P0 of the first conductive type extending from the surface of the substrate SUB to the bottom of the substrate SUB in each of the a, b, and c regions, and a second impurity region (n– region) of the second conductive type, such as N-type, adjoining the first impurity region P0 and extending from the first impurity region P0 to each of the formation depths d1', d2', and d3' of the photodiodes PD1 to PD3.

A microlens ML may be formed on the top, overlapped with the photodiodes PD1 to PD3. According to the related art having the above-mentioned configuration, each color may be realized in the first to third unit pixel regions a, b, and c without respective color filters.

RGB, which may have three primary colors of light, may have different wavelengths. R may have a wavelength of about 0.55 μm to 0.6 μm, G may have a wavelength of about 0.45 μm to 0.55 μm, and B may have a wavelength of about 0.35 μm to 0.45 μm. Due to the relative differences in wavelength, the B color having a relatively short wavelength may have less depth of transmission through the silicon substrate SUB than the G color, and the G color may have less depth of transmission through the silicon substrate SUB than the R color.

Thus, the depth at which each color enters the substrate SUB and forms an electron hole pair may vary. By taking the depth of transmission varying with the wavelength differences between lights of respective colors into consideration, the n− region of the photodiode PD3 is made shallow in the unit pixel region c for realizing the B color having a short wavelength, the n− region of the photodiode PD2 is made deeper than 'c' in the unit pixel region b for realizing the G color having a longer wavelength than the B color, and the n− region of the photodiode PD1 is made deeper than 'b' in the unit pixel region a for realizing the R color having a longer wavelength than the G color.

White light is a mixture of all the wavelengths of light. The light of each wavelength may have different penetration depth. That is, light passes through the silicon substrate SUB and the wavelengths of RGB penetrate to different depths. The difference in penetration depth may be an optical characteristic, and therefore the penetration depth may not be adjusted as desired. As the wavelengths may penetrate to the penetration depth d1' from the white light that has reached the surface of the substrate SUB of 'a', the wavelengths of the colors excluding the R color may be all extinguished and only the light having the wavelength of the R color may enter the first photodiode PD1 to generate photoelectrons.

As the wavelengths may penetrate to the penetration depth d3' from the white light that may have reached the surface of the substrate SUB of 'c', R and G pass through the silicon substrate SUB and may be all extinguished, and only the light having the wavelength of the B color may enter the third photodiode PD3 to generate photoelectrons. The same applies to 'b'.

According to the related art, colors may be realized without the use of color filters. In case of a product using a linear sensor, however, pixels may not be disposed like a general image sensor because they may have to be disposed transversely due to the characteristics of the linear sensor, and thus red, green, and blue may be disposed separately. Consequently, the longitudinal width of a chip may need to be maximized, thus relatively enlarging the overall chip size.

SUMMARY

In view of the above, the embodiments provide an image sensor for a semiconductor light-sensitive device, which may realize colors without the use of color filters only by including at least two optical devices (e.g. a light receiving device and an electron collecting device) because the image sensor may be designed and fabricated in such a manner as to include at least one electron collecting device permitting part of the electrons generated by light in the light receiving device to move thereto without directly receiving light, and a method for fabricating substantially the same.

Embodiments may provide an image processing apparatus including an image sensor and a method for detecting a color signal using substantially the same. In accordance with embodiments, there may be provided an image sensor for a semiconductor light-sensitive device, the image sensor including at least one of: (1) A semiconductor substrate. (2) A light receiving device which may be configured to be formed within the semiconductor substrate to receive light. (3) An electron collecting device which may be configured to be formed within the semiconductor substrate to permit part of the electrons generated by the light in the light receiving device to move thereto. (4) A first type device isolation film which may be configured to isolate the light receiving device from the electron collecting device. (5) A shielding film which may be configured to be formed on and/or over top of the semiconductor substrate to shield the first electron collecting device from the light.

In embodiments, the light receiving device may have a relatively greater width than the electron collecting device. The image sensor may further comprise an electron movement guide layer configured to be formed between the light receiving device and the electron collecting device which may be formed within the semiconductor substrate, in accordance with embodiments.

In embodiments, the electron collecting device may include at least one of: (1) A first electron collecting device configured to be isolated from the light receiving device by the first type device isolation film. (2) A second electron collecting device may be configured to be isolated from the first electron collecting device, wherein the image sensor may further include (in embodiments) a second type device isolation film configured to isolate the adjacent first electron collecting device and second electron collecting device from each other.

The first type device isolation film may have a relatively greater width than the second type device isolation film, in accordance with embodiments. The image sensor may include at least one of: (1) A first electron movement guide layer configured to be formed in the area extending from the position of the light receiving device to the position of the first electron collecting device at a specific light receiving depth of the light receiving device. (2) A second electron movement guide layer which may be configured to be formed in the area extending from the position of the light receiving device to the position of the second electron collecting device at a light receiving depth relatively greater than the specific light receiving depth.

In accordance with embodiments, a method for manufacturing an image sensor for a semiconductor light-sensitive device may include at least one of: (1) Forming a first type device isolation film which may be configured to define an active region within a semiconductor substrate. (2) Forming a light receiving device which may be configured to receive light within the semiconductor substrate and an electron collecting device may be configured to permit part of the electrons generated by the light to move thereto to be isolated by the first type isolation film. (3) Forming a shielding film on top of the semiconductor substrate to shield the electron collecting device from the light.

In embodiments, the light receiving device may be formed to have a relatively greater width than the electron collecting device. The method may further include forming an electron movement guide layer between the light receiving device and the electron collecting device which are formed within the semiconductor substrate. The electron collecting device may be formed to include a first electron collecting device isolated from the light receiving device by the first type device isolation film and a second electron collecting device may be isolated from the first electron collecting device, and the first type device isolation film may be formed together with a second type device isolation film configured to isolate the adjacent first electron collecting device and second electron collecting device from each other, in accordance with embodiments.

In embodiments, the first type device isolation film may be formed to have a greater width than the second type device isolation film. The method may further include at least one of: (1) Forming a first electron movement guide layer in the area extending from the position of the light receiving device to the position of the first electron collecting device at a specific light receiving depth of the light receiving device. (2) Forming a second electron movement guide layer in the area extending from the position of the light receiving device to the position of the second electron collecting device at a light receiving depth relatively greater than the specific light receiving depth.

In accordance with embodiments, there may be provided an image processing apparatus using an image sensor for a semiconductor light-sensitive device, wherein the image processing apparatus may include an image sensor for a semiconductor light-sensitive device and a signal processor, wherein the image sensor may include at least one of: (1) A semiconductor substrate. (2) A light receiving device which may be configured to be formed within the semiconductor substrate to receive light. (3) Electron collecting device which may be configured to be formed within the semiconductor substrate to permit part of the electrons generated by the light in the light receiving device to move thereto. (4) A first type device isolation film which may be configured to isolate the light receiving device from the electron collecting device. (5) A shielding film which may be configured to be formed on and/or over top of the semiconductor substrate to shield the electron collecting device from the light, wherein the signal processor may detect a color signal included in the light based on a ratio between optical current flowing through the light receiving device and optical current flowing through the electron collecting device.

The electron collecting device may include at least one of: (1) A first electron collecting device isolated from the light receiving device by the first type device isolation film. (2) A second electron collecting device which may be configured to be isolated from the first electron collecting device, wherein the image sensor may further include a second type device isolation film configured to isolate the adjacent first electron collecting device and second electron collecting device from each other. (3) A first electron movement guide layer which may be configured to be formed in the area extending from the position of the light receiving device to the position of the first electron collecting device at a specific light receiving depth of the light receiving device. (4) A second electron movement guide layer configured to be formed in the area extending from the position of the light receiving device to the position of the second electron collecting device at a light receiving depth relatively greater than the specific light receiving depth, and wherein the signal processor may detect a color signal included in the light based on a ratio among optical current flowing through the light receiving device, optical current flowing to the first electron collecting device through the first electron movement guide layer, and, optical current flowing to the second electron collecting device through the second electron movement guide layer.

In accordance with embodiments, there may be provided a method for detecting a color signal by an image processing apparatus including an image sensor for a semiconductor light-sensitive device, wherein the image sensor may include at least one of: (1) A semiconductor substrate. (2) A light receiving device which may be configured to be formed within the semiconductor substrate to receive light. (3) Electron collecting device which may be configured to be formed within the semiconductor substrate to permit part of the electrons generated by the light in the light receiving device to move thereto. (4) A first type device isolation film which may be configured to isolate the light receiving device from the electron collecting device. (5) A shielding film configured to be formed on and/or over the top of the semiconductor substrate to shield the electron collecting device from the light, wherein the method for detecting a color signal may detect a color signal included in the light based on a ratio between optical current flowing through the light receiving device and optical current flowing through the electron collecting device.

The electron collecting device may include at least one of: (1) A first electron collecting device isolated from the light receiving device by the first type device isolation film. (2) A second electron collecting device configured to be isolated from the first electron collecting device, wherein the image sensor may further include (in embodiments) a second type device isolation film configured to isolate the adjacent first electron collecting device and second electron collecting device from each other. (3) A first electron movement guide layer configured to be formed in the area extending from the position of the light receiving device to the position of the first electron collecting device at a specific light receiving depth of the light receiving device. (4) A second electron movement guide layer which may be configured to be formed in the area extending from the position of the light receiving device to the position of the second electron collecting device at a light receiving depth which may be relatively greater than the specific light receiving depth, wherein the method for detecting a color signal may detect the color signal included in the light based on a ratio among optical current flowing through the light receiving device, optical current flowing to the first electron collecting device through the first electron movement guide layer, and optical current flowing to the second electron collecting device through the second electron movement guide layer.

In accordance with the embodiments, colors may be realized without the use of color filters, and therefore the process yield may be maximized, thereby minimizing the cost and relatively improving the overall chip performance. In embodiments, colors may be realized without the use of color filters only by including at least two optical devices (e.g. a light receiving device and an electron collecting device) because the image sensor may be designed and fabricated in such a manner as to include at least one electron collecting device permitting part of the electrons generated by light in the light receiving device to move thereto without directly receiving light. As a consequence, the process yield may be further maximized, thereby minimizing the cost and relatively improving the overall chip performance. In addition, the overall chip size may be minimized as the longitudinal width of a chip may be reduced in case of a product using a linear sensor.

DRAWINGS

The above and other objects and features of embodiments may become apparent from the following description of embodiments, given in conjunction with the accompanying drawings, in which.

Example

Example

Example

Example

Example

Example

Example

Example

Example

DESCRIPTION

Advantages and features of embodiments' methods of accomplishing substantially the same may be understood more readily by reference to the following detailed description of embodiments and the accompanying drawings. The embodiments may, however, be embodied in many different forms and may not be construed as being limited to the embodiments set forth herein. Rather, these embodiments may be provided so that this disclosure may be thorough and complete and may fully convey the concept of the embodiments to those skilled in the art, and the embodiments may only be defined by the appended claims.

Figure 2:
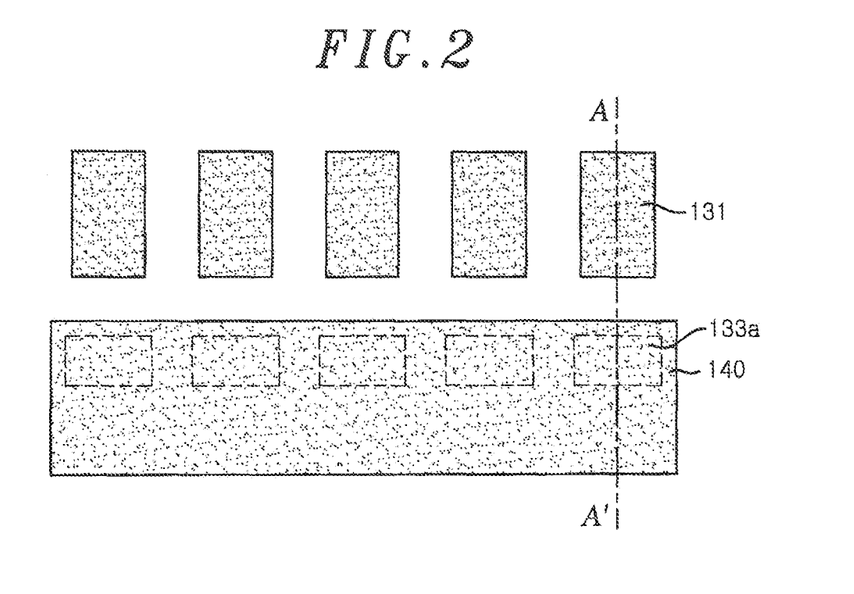
FIG. 2 is a top plan view of an image sensor for a semiconductor light-sensitive device, in accordance with embodiments.

Example FIG. 2 is a top plan view of an image sensor for a semiconductor light-sensitive device, in accordance with embodiments. Example FIG. 3 is a cross-sectional view taken along virtual line A-A' of FIG. 2 to explain the structure of the image sensor for the semiconductor light-sensitive device, in accordance with embodiments.

Figure 3:
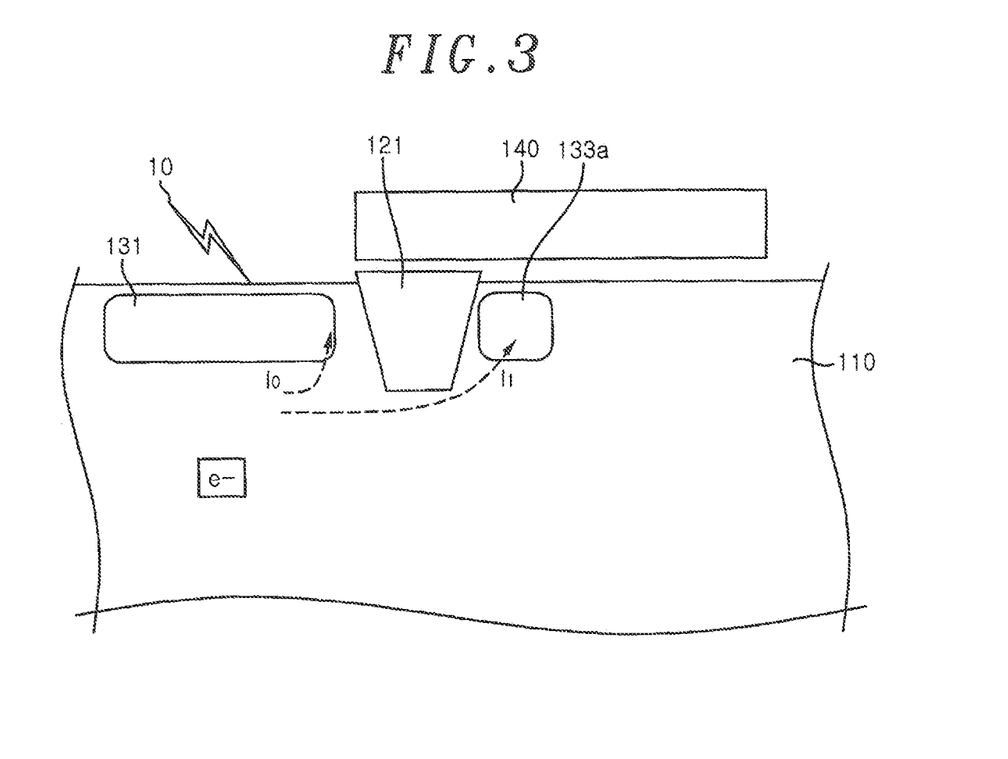
FIG. 3 is a cross-sectional view illustrating the structure of the image sensor for the semiconductor light-sensitive device, in accordance with embodiments.

As shown in FIGS. 2 and 3, an image sensor in accordance with embodiments may include a semiconductor substrate 110. A light receiving device 131 may be formed within the semiconductor substrate 110 to receive light 10. A first electron collecting device 133a may be formed within the semiconductor substrate 110 to permit part of the electrons generated by the light 10 in the light receiving device 131 to move thereto. A first type device isolation film 121 for isolating the light receiving device 131 from the first electron collecting device 133a, and a shielding film 140 may be formed on and/or over the top of the semiconductor substrate 110 to shield the first electron collecting device 133a from the light 10.

In the image sensor for the semiconductor light-sensitive device, the light receiving device 131 may directly receive the light 10. However, the first electron collecting device 133a may not directly receive the light 10 because it may be shielded from the light 10 by the shielding film 140, and instead may permit part of the electrons generated by the light 10 in the light receiving device 131 to move thereto. Therefore, the image sensor may be designed and fabricated in such a manner that the width of the light receiving device 131 may be relatively greater than the width of the first electron receiving device 133a in order to maximize the light-sensing efficiency even while minimizing the size of a unit pixel.

In the thus-configured image sensor for the semiconductor light-sensitive device in accordance with embodiments, when the light receiving device 131 receives the light 10, optical current $I_0$ may flow in the light receiving device 131, and part of the electrons generated by the light receiving device 131 may move to the first electron collecting device 133a to cause optical current $I_1$ to flow through the first electron collecting device 133a.

RGB, which are the three primary colors of light, have different wavelengths. R has a wavelength of about 0.55 µm to 0.6 µm, G has a wavelength of about 0.45 µm to 0.55 µm, and B has a wavelength of about 0.35 µm to 0.45 µm. Due to the relative differences in wavelength, the B color having a short wavelength may have a relatively less depth of transmission through the semiconductor substrate 110 than the G color, and the G color may have a relatively less depth of transmission through the semiconductor substrate 110 than the R color. Thus, the depth at which each color enters the semiconductor substrate 110 and forms an electron hole pair may vary. Moreover, the greater the depth of transmission through the semiconductor substrate 110, the more the number of the electrons overflowing the first type device isolation film 121 and moving to the first electron collecting device 133a. As a result, the optical current $I_1$ flowing through the first electron collecting device 133a may maximize. That is, the ratio between the optical current $I_0$ flowing through the light receiving device 131 and the optical current $I_1$ flowing through the first electron collecting device 133a may vary with each wavelength of the light 10.

In embodiments, if a resultant value is set in a signal processor in advance, the resultant value being obtained by measuring the ratio between the optical current $I_0$ flowing through the light receiving device 131 and the optical current flowing through the first electron collecting device 133a for each wavelength of the light 10, the signal processor may determine the wavelength of the light 10 based on the ratio between the optical current $I_0$ flowing through the light receiving device 131 and the optical current $I_1$ flowing through the first electron collecting device 133a, and may detect a color signal corresponding to the determined wavelength.

Figure 4:
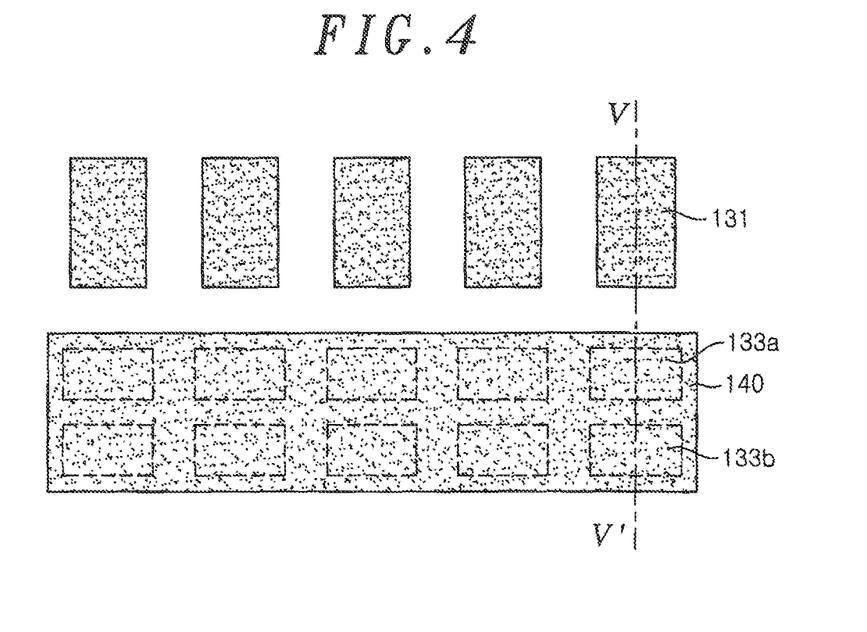
FIG. 4 is a top plane view of an image sensor for a semiconductor light-sensitive device, in accordance with embodiments.
Figure 5:
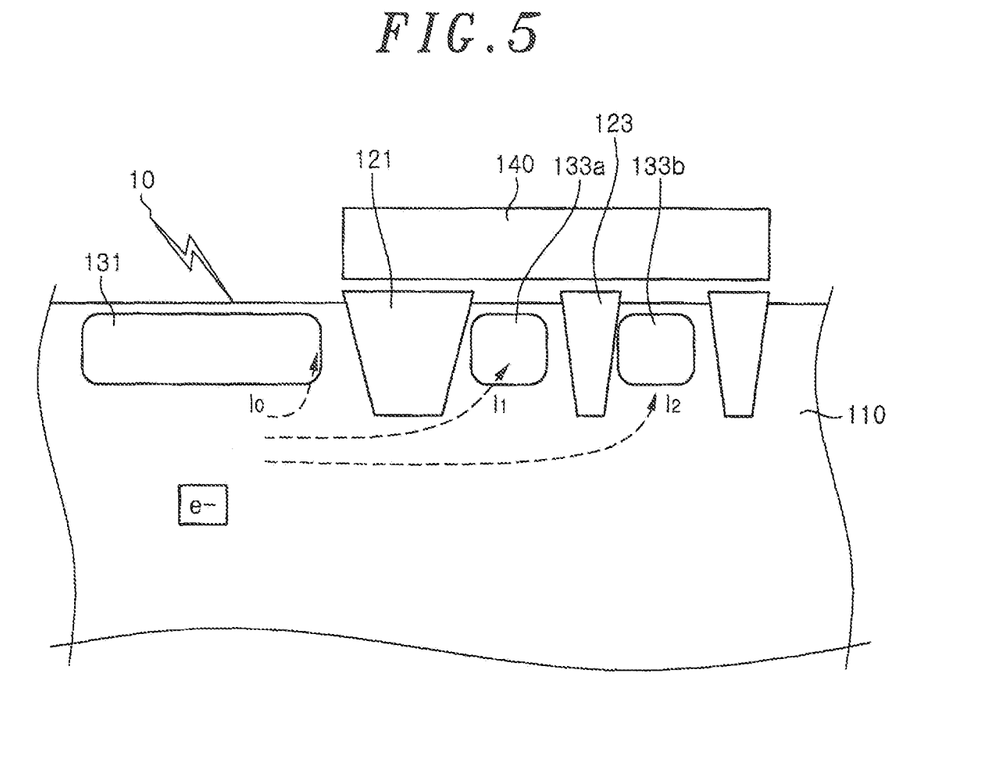
FIG. 5 is a cross-sectional view taken along virtual line V-V' shown in FIG. 4 to explain the structure of the image sensor for the semiconductor light-sensitive device in accordance with embodiments.

FIG. 4 is a top plane view of an image sensor for a semiconductor light-sensitive device in accordance with embodiments. FIG. 5 is a cross-sectional view taken along virtual line V-V' shown in FIG. 4 to explain the structure of the image sensor for the semiconductor light-sensitive device in accordance with embodiments.

In comparison with the above-described image sensor in accordance with embodiments, the image sensor in accordance with embodiments illustrated in FIGS. 4 and 5 may further include a second electron collecting device 133b formed at a predetermined depth in an upper portion of the semiconductor substrate 110 so as to be electrically isolated from the first electron collecting device 133a, and a second type device isolation film 123 for isolating the adjacent first electron collecting device 133a and second electron collecting device 133b from each other. It may be formed such that the width of the second type device isolation film 123 may be relatively smaller than the width of the first type device isolation film 121. This may be to prevent the distance between the light receiving device 131 and the second electron collecting device 133b from being unnecessarily maximized so that the electrons generated in the light receiving device 131 may be properly move to the second electron collecting device 133b, in accordance with embodiments.

Embodiments may further include the second electron collecting device 133b and the second type device isolation film 123. If a resultant value is set in a signal processor in advance, the resultant value being obtained by measuring the ratio among the optical current $I_0$ flowing through the light receiving device 131, the optical current $I_1$ flowing through the first electron collecting device 133a, and the optical current $I_2$ flowing through the second electron collecting device 133b for each wavelength of the light 10, in accordance with embodiments. In embodiments, the signal processor may determine the wavelength of the light 10 based on the ratio among the optical current $I_0$ flowing through the light receiving device 131, the optical current $I_1$ flowing through the first electron collecting device 133a, and the optical current $I_2$ flowing through the second electron collecting device 133b, and may detect a color signal corresponding to the determined wavelength.

In comparison with the embodiments which may not include the second electron collecting device 133b but only the first electron collecting device 133a, embodiments may more accurately measure the wavelength of the light 10 received by the light receiving device 131. This is because the number of comparison factors for determining wavelength may be maximized from two optical current values $I_0$ and $I_1$ to three optical current values $I_0$, $I_1$, and $I_2$.

Figure 6A:
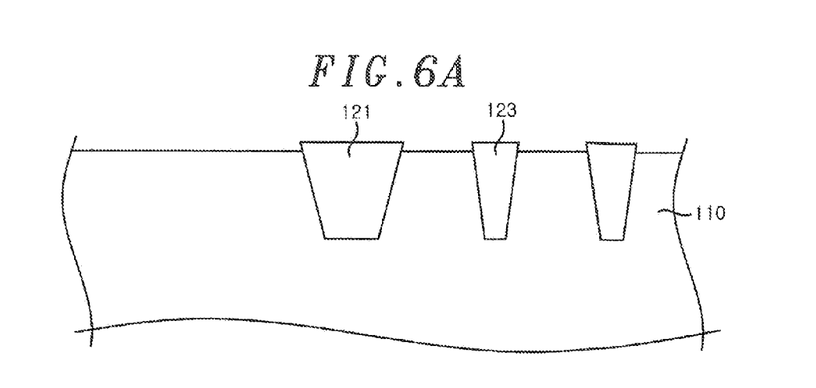
FIGS. 6A to 6C are cross-sectional views illustrating a method for fabricating an image sensor for a semiconductor light-sensitive device, in accordance with embodiments.
Figure 6B:
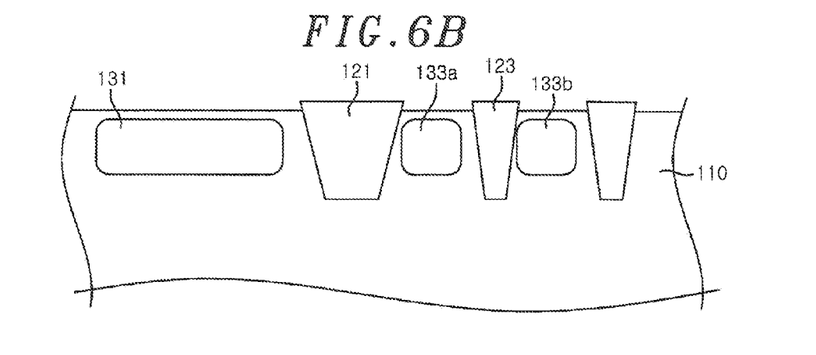
Figure 6C:
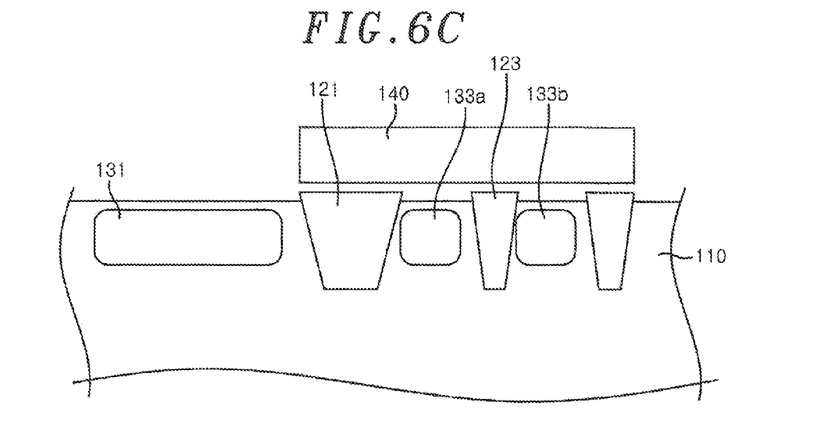

FIGS. 6A to 6C are cross-sectional views illustrating a method for fabricating an image sensor for a semiconductor light-sensitive device in accordance with embodiments. Referring to FIGS. 6a to 6c, the method for fabricating an image sensor for a semiconductor light-sensitive device may include the second electron collecting device 133b and the second type device isolation film 123, in accordance with embodiments.

Referring to FIG. 6A, a first type device isolation film 121 and a second type device isolation film 123, which may define active regions, may be formed within the semiconductor substrate 110. In embodiments, the width of the second type device isolation film 123 may be relatively smaller than the width of the first type device isolation film 121. This may be to prevent the distance between the light receiving device 131 and the second electron collecting device 133b, which may be formed later, from being unnecessarily maximized so that the electrons generated in the light receiving device 131 may properly move to the second electron collecting device 133b.

Referring to FIG. 6B, the light receiving device 131 may be formed within the semiconductor substrate 110 to receive light, the first electron collecting device 133a to which part of the electrons may be generated by light move may be formed to be isolated by the first type device isolation film 121, and the second electron collecting device 133b to which part of the electrons may move from the light receiving device 131 may be formed to be isolated by the second type device isolation film 123, in accordance with embodiments. In embodiments, the light receiving device 131, the first electron collecting device 133a, and the second electron collecting device 133b may be simultaneously formed, and the formation order may be interchangeable even if they may be sequentially formed.

Referring to FIG. 6C, the shielding film 140 may be formed on and/or over the top of the semiconductor substrate 110 to shield the first type device isolation film 121, the first electron collecting device 133a, the second type device isolation film 123, and the second electron collecting device 133b from external light, in accordance with embodiments. In embodiments, the shielding film 140 may be formed of a non-transmissive metal. In embodiments, although the light receiving device 131 may directly receive light, the first electron collecting device 133a and the second electron collecting device 133b may not directly receive external light because they may be shielded from the external light by the shielding film 140, but part of the electrons generated in the light receiving device may be moved by the external light. Therefore, in order to maximize the light sensing efficiency even while minimizing the size of a unit pixel, the image sensor may be designed and fabricated so that the width of the light receiving device 131 may be relatively greater than that of the first electron collecting device 133a and the second electron collecting device 133b.

Figure 7:
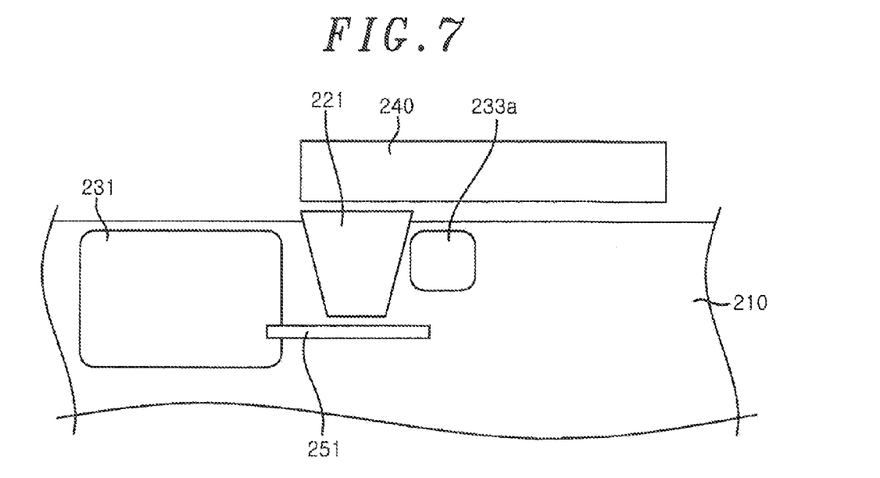
FIG. 7 is a cross-sectional view illustrating the structure of an image sensor for a semiconductor light-sensitive device, in accordance with embodiments.

FIG. 7 is a cross-sectional view illustrating the structure of an image sensor for a semiconductor light-sensitive device in accordance with embodiments. As shown in FIG. 7, the image sensor in accordance with embodiments may include a semiconductor substrate 210. A light receiving device 231 may be formed within the semiconductor substrate 210 to receive external light. A first electron collecting device 233a may be formed within the semiconductor substrate 210 to permit part of the electrons generated by the light in the light receiving device 231 to move thereto. A first type device isolation film 221 for isolating the light receiving device 231 from the first electron collecting device 233a and a first electron movement guide layer 251 may be formed in the area extending from the position of the light receiving device 231 to the position of the first electron collecting device 233a at a specific light receiving depth of the light receiving device 231 within the semiconductor substrate 210. A shielding film 240 may be formed on and/or over the top of the semiconductor substrate 210 to shield the first electron collecting device 233a from the light 10.

In the image sensor for the semiconductor light-sensitive device, the light receiving device 231 may directly receive the light. However, the first electron collecting device 233a may not directly receive the external light because it may be shielded from the external light by the shielding film 240, and instead may permit part of the electrons generated by the external light in the light receiving device 231 to move thereto. Therefore, in embodiments, the image sensor may be designed and fabricated in such a manner that the width of the light receiving device 231 may be relatively greater than the width of the first electron receiving device 233a in order to maximize the light-sensing efficiency even while minimizing the size of a unit pixel.

Figure 8:
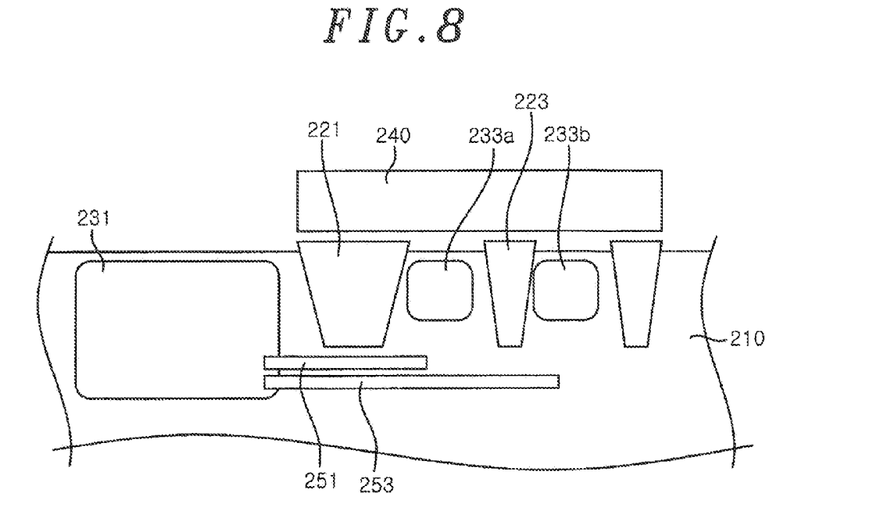
FIG. 8 is a cross-sectional view illustrating the structure of an image sensor for a semiconductor light-sensitive device, in accordance of embodiments.

FIG. 8 is a cross-sectional view for explaining the structure of an image sensor for a semiconductor light-sensitive device, in accordance with embodiments. In comparison with the image sensor of FIG. 7, as shown in FIG. 8, the image sensor in accordance with embodiments may further include at least one of: (1) A second electron collecting device 233b that may be formed at a predetermined depth in an upper portion of the semiconductor substrate 210 so as to be electrically isolated from the first electron collecting device 233a. (2) A second type device isolation film 223 for isolating the first electron collecting device 233a and the second electron collecting device 233b adjacent to each other. (3) A second electron movement guide layer 253 formed in the area extending from the position of the light receiving device 231 to the position of the second electron collecting device 233b at a light receiving depth relatively greater than the formation depth of the first electron movement guide layer 251.

In embodiments, the width of the second type device isolation film 123 may be relatively smaller than the width of the first type device isolation film 221. This may be done (in embodiments) to prevent the distance between the light receiving device 231 and the second electron collecting device 233b from being unnecessarily maximized so that the electrons generated in the light receiving device 231 may properly move to the second electron collecting device 233b.

It can be seen that the image sensor in accordance with embodiments shown in FIG. 8 may further include the first electron movement guide layer 251 and the second electron movement guide layer 253, which is different to embodiments illustrated in FIG. 5. The first electron movement guide layer 251 and the second electron movement guide layer 253 may further facilitate the movement of electrons from the light receiving device 231 to the first electron collecting device 233a and the second electron collecting device 233b.

Figure 9A:
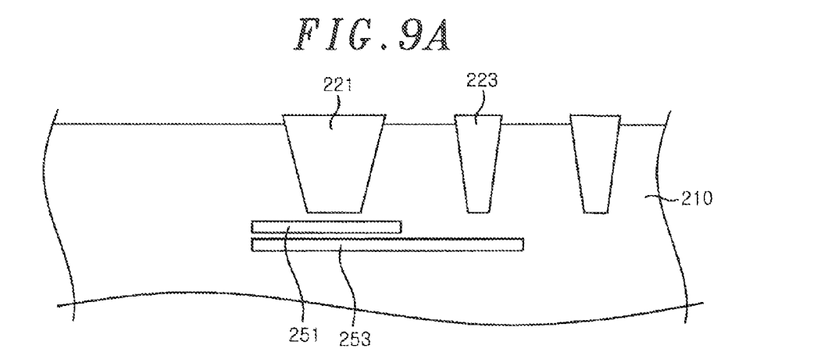
FIGS. 9A to 9C are cross-sectional views illustrating a method for fabricating an image sensor for a semiconductor light-sensitive device, in accordance with embodiments.
Figure 9B:
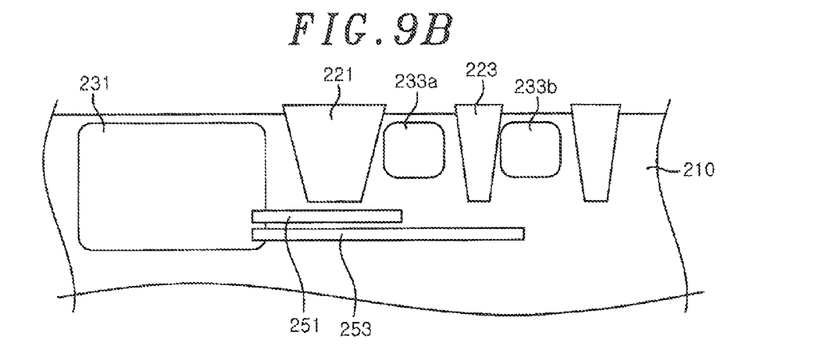
Figure 9C:
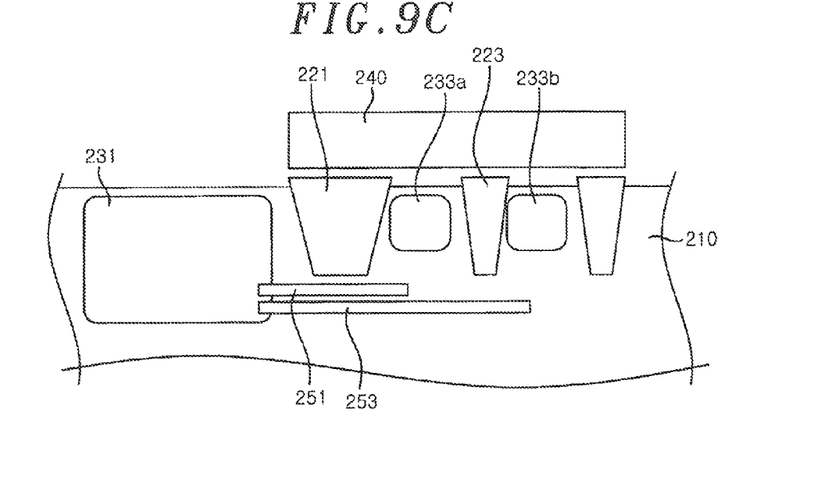

FIGS. 9A to 9C are cross-sectional views for explaining a method for fabricating an image sensor for a semiconductor light-sensitive device, in accordance with embodiments. FIGS. 9A to 9C illustrate a method for fabricating an image sensor for a semiconductor light-sensitive device including the second electron collecting device 233b, the second type device isolation film 223, and the second electron movement guide layer 253, in accordance with embodiments.

Referring to FIG. 9A, the first electron movement guide layer 251 may be formed in the area extending from the position of the light receiving device 231 to the position of the first electron collecting device 233a at a specific light receiving depth of the light receiving device 231, in accordance with embodiments. The second electron movement guide layer 253 may be formed in the area extending from the position of the light receiving device 231 to the position of the second electron collecting device 233b at a light receiving depth relatively greater than the formation depth of the first electron movement guide layer 251, in accordance with embodiments. In embodiments, the first electron movement guide layer 251 may be formed at a specific light receiving depth by a first ion implantation process for implanting impurity ions, and then the second electron movement guide layer 253 may be formed at a greater light receiving depth by a second ion implantation process for implanting impurity ions.

In embodiments, a first type device isolation film 221 and a second type device isolation film 223, which may define active regions, may be formed within the semiconductor substrate 210. In embodiments, the width of the second type device isolation film 223 may be relatively smaller than the width of the first type device isolation film 221. This may be done to prevent the distance between the light receiving device 231 and the second electron collecting device 233b from being unnecessarily maximized so that the electrons generated in the light receiving device 231 may properly move to the second electron collecting device 233b.

Referring to FIG. 9B, the light receiving device 231 may be formed within the semiconductor substrate 210 to receive light, in accordance with embodiments. The first electron collecting device 233a to which part of the electrons generated by light move may be formed to be isolated by the first type device isolation film 221, in accordance with embodiments. The second electron collecting device 233b to which part of the electrons may move from the light receiving device 231 may be formed to be isolated by the second type device isolation film 223, in accordance with embodiments. In embodiments, the light receiving device 231, the first electron collecting device 233a, and the second electron collecting device 233b may be simultaneously formed, and the formation order may be interchangeable even if they may be sequentially formed.

Referring to FIG. 9C, the shielding film 240 may be formed on and/or over the top of the semiconductor substrate 210 to shield the first type device isolation film 221, the first electron collecting device 233a, the second type device isolation film 223, and the second electron collecting device 233b from external light, in accordance with embodiments. In embodiments, the shielding film 240 may be formed of a non-transmittive metal. In embodiments, although the light receiving device 231 may directly receive light, the first electron collecting device 233a and the second electron collecting device 233b may not directly receive external light as they may be shielded from the external light by the shielding film 240, but part of the electrons generated in the light receiving device may move by the external light. In embodiments, in order to maximize the light sensing efficiency even while minimizing the size of a unit pixel, the image sensor may be designed and fabricated so that the width of the light receiving device 231 may be relatively greater than that of the first electron collecting device 233a and the second electron collecting device 233b.

It will be obvious and apparent to those skilled in the art that various modifications and variation can be made in the embodiments disclosed. Thus it is intended that the disclosed embodiments cover the obvious and apparent modifications and variations, provided that they are within the scope of the appended claims and their equivalents.

What is claimed is:

1. An apparatus comprising:
   a semiconductor substrate;
   a light receiving device formed in the semiconductor substrate, wherein the light receiving device is configured to receive light and generate electrons in response to the received light;
   at least one electron collecting device formed in the semiconductor substrate, wherein said at least one electron collecting device is configured to receive at least a portion of the electrons generated by the light receiving device;
   a first device isolation film configured to isolate the light receiving device from said at least one electron collecting device, wherein said at least one electron collecting device is located separate from the first device isolation film, wherein said at least one electron collecting device comprises a first electron collecting device isolated from the light receiving device by the first device isolation film and a second electron collecting device isolated from the first electron collecting device, wherein the first electron collecting device is adjacent to the second electron collecting device;
   a second device isolation film, wherein the second device isolation film is configured to isolate the first electron collecting device and second electron collecting device; and
   a shielding film formed over the semiconductor substrate, wherein the shielding film is configured to shield said at least one electron collecting device from light.

2. The apparatus of claim 1, wherein the apparatus is an image sensor for a semiconductor light-sensitive device.

3. The apparatus of claim 1, wherein the light receiving device has a width that is greater than said at least one electron collecting device.

4. The apparatus of claim 1, comprising at least one electron movement guide layer formed in the semiconductor substrate, wherein said at least one electron movement guide layer is configured to guide electrons generated in the light receiving device to said at least one electron collecting device.

5. The apparatus of claim 4, wherein said at least one electron movement guide layer is formed under the first type isolation film.

6. The apparatus of claim 1, wherein the first device isolation film has a width greater than the second device isolation film.

7. The apparatus of claim 1, wherein:
   said at least one electron movement guide layer comprises a first electron movement guide layer formed in the semiconductor substrate, formed under the first device isolation film, and formed substantially between the light receiving device and the first electron collecting device at a specific light receiving depth of the light receiving device; and
   a second electron movement guide layer formed in the semiconductor substrate, formed under the first device isolation film, formed under the second device isolation film, and formed substantially between the light receiving device and the second electron collecting device at a specific light receiving depth of the light receiving device.

8. The apparatus of claim 7, wherein:

the width of the second electron movement guide layer is greater than the first electron movement guide layer;

the second electron movement guide layer is formed under the first electron movement guide layer.

9. An apparatus comprises:

a semiconductor substrate;

a light receiving device formed in the semiconductor substrate and configured to receive light;

an electron collecting device formed in the semiconductor substrate and configured to receive at least a portion of electrons generated by light received by the light receiving device;

a first device isolation film formed in the semiconductor substrate and configured to isolate the light receiving device from the electron collecting device, wherein said at least one electron collecting device is located separate from the first type device isolation film, wherein said at least one electron collecting device comprises a first electron collecting device isolated from the light receiving device by the first device isolation film and a second electron collecting device isolated from the first electron collecting device, wherein the first electron collecting device is adjacent to the second electron collecting device;

a second device isolation film, wherein the second device isolation film is configured to isolate the first electron collecting device and second electron collecting device; and a shielding film formed over the semiconductor substrate and configured to shield the electron collecting device from light, wherein a signal processor detects a color signal included in the light based on a ratio between optical current flowing through the light receiving device and optical current flowing through the electron collecting device.

10. The apparatus of claim 9, wherein:

the apparatus is an image processing apparatus using an image sensor in a semiconductor light-sensitive device; and the image processing apparatus comprises an image sensor and the signal processor.

* * * * *